United States Patent
Ho et al.

(10) Patent No.: US 9,230,052 B2
(45) Date of Patent: Jan. 5, 2016

(54) METHOD OF GENERATING A SIMULATION MODEL OF A PREDEFINED FABRICATION PROCESS

(71) Applicant: TAIWAN SEMICONDUCTOR MANUFACTURING COMPANY, LTD., Hsinchu (TW)

(72) Inventors: Chia-Ming Ho, Hsinchu (TW); Ke-Ying Su, Taipei (TW); Hsiao-Shu Chao, Baoshan Township (TW); Yi-Kan Cheng, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/531,374

(22) Filed: Nov. 3, 2014

(65) Prior Publication Data

US 2015/0052493 A1 Feb. 19, 2015

Related U.S. Application Data

(62) Division of application No. 13/370,994, filed on Feb. 10, 2012, now Pat. No. 8,887,106.

(60) Provisional application No. 61/580,864, filed on Dec. 28, 2011.

(51) Int. Cl.
*G06F 17/50* (2006.01)
*G03F 1/36* (2012.01)
*G03F 1/70* (2012.01)
*G03F 7/20* (2006.01)

(52) U.S. Cl.
CPC .............. *G06F 17/5081* (2013.01); *G03F 1/36* (2013.01); *G03F 1/70* (2013.01); *G03F 7/70433* (2013.01); *G03F 7/70441* (2013.01); *G06F 17/5072* (2013.01)

(58) Field of Classification Search
CPC ......... G03F 1/36; G03F 1/70; G03F 17/5081; G03F 17/5072; G03F 7/70441; G03F 7/70433
See application file for complete search history.

(56) References Cited

U.S. PATENT DOCUMENTS

| | | | |
|---|---|---|---|
| 5,692,115 A | 11/1997 | Itoh et al. | |
| 5,783,846 A | 7/1998 | Baukus et al. | |
| 5,821,014 A | 10/1998 | Chen et al. | |
| 5,877,964 A | 3/1999 | Liebmann et al. | |
| 6,168,891 B1 | 1/2001 | Shibata | |
| 6,425,117 B1 | 7/2002 | Pasch et al. | |
| 6,787,271 B2 | 9/2004 | Cote et al. | |
| 6,883,159 B2* | 4/2005 | Schenker et al. | 430/5 |
| 6,887,630 B2 | 5/2005 | Luttrell | |
| 7,001,693 B2* | 2/2006 | Liebmann et al. | 430/5 |

(Continued)

*Primary Examiner* — Naum B Levin
(74) *Attorney, Agent, or Firm* — Hauptman Ham, LLP

(57) ABSTRACT

A method of generating a simulation model of a predefined fabrication process according to a sample conductive feature includes receiving a geometry configuration and layout design of the conductive feature. A circuit-level simulation model of the sample conductive feature based on the geometry configuration of the sample conductive feature is generated. A hardware processor converts the circuit-level simulation model of the sample conductive feature into at least a first layout bias rule corresponding to a first set of predetermined criteria of the layout design and a second layout bias rule, different from the first layout bias rule, corresponding to a second set of predetermined criteria of the layout design.

20 Claims, 6 Drawing Sheets

(56) References Cited

U.S. PATENT DOCUMENTS

| | | |
|---|---|---|
| 7,052,808 B2 * | 5/2006 | Liu et al. ............................ 430/5 |
| 7,080,349 B1 * | 7/2006 | Babcock et al. ................. 716/53 |
| 7,153,728 B2 | 12/2006 | Morita |
| 7,293,249 B2 * | 11/2007 | Torres Robles et al. ........ 716/53 |
| 7,313,769 B1 | 12/2007 | Lukanc et al. |
| 7,354,681 B2 * | 4/2008 | Laidig et al. ...................... 430/5 |
| 7,392,497 B2 | 6/2008 | Fassnacht et al. |
| 7,404,167 B2 | 7/2008 | Chuang et al. |
| 7,445,874 B2 | 11/2008 | Tan et al. |
| 7,517,642 B2 * | 4/2009 | Liu ............................... 430/394 |
| 7,519,929 B2 | 4/2009 | Li |
| 7,632,610 B2 * | 12/2009 | Wallace et al. .................... 430/5 |
| 7,650,588 B2 | 1/2010 | Ivansen |
| 7,669,161 B2 | 2/2010 | Lin |
| 7,673,260 B2 | 3/2010 | Chen et al. |
| 7,730,432 B1 | 6/2010 | Gupta et al. |
| 7,735,053 B2 | 6/2010 | Harazaki |
| 7,743,349 B2 | 6/2010 | Gupta et al. |
| 7,765,498 B1 | 7/2010 | Ho et al. |
| 7,767,515 B2 | 8/2010 | Moroz et al. |
| 7,783,999 B2 * | 8/2010 | Ou et al. ....................... 716/136 |
| 7,818,698 B2 | 10/2010 | Su et al. |
| 7,824,826 B2 | 11/2010 | Hsu et al. |
| 7,923,266 B2 | 4/2011 | Thijs et al. |
| 7,975,244 B2 * | 7/2011 | Mukherjee et al. .............. 716/51 |
| 8,032,348 B2 * | 10/2011 | Mitrovic et al. ................. 703/13 |
| 8,037,575 B2 | 10/2011 | Cheng et al. |
| 8,129,750 B2 | 3/2012 | Becker et al. |
| 8,150,140 B2 | 4/2012 | Kitamura et al. |
| 8,151,236 B2 | 4/2012 | Su et al. |
| 8,185,865 B2 * | 5/2012 | Gupta et al. ................... 716/139 |
| 8,274,099 B2 * | 9/2012 | Becker ........................... 257/206 |
| 8,361,684 B2 * | 1/2013 | Hsieh et al. ...................... 430/30 |
| 8,543,958 B2 | 9/2013 | Chen et al. |
| 8,713,483 B2 * | 4/2014 | Tritchkov et al. ............... 716/50 |
| 2004/0005089 A1 * | 1/2004 | Robles et al. ................... 382/141 |
| 2006/0107246 A1 | 5/2006 | Nakamura |
| 2006/0150132 A1 | 7/2006 | Gupta |
| 2007/0118320 A1 | 5/2007 | Luo et al. |
| 2007/0130558 A1 | 6/2007 | Ivansen |
| 2008/0003510 A1 | 1/2008 | Harazaki |
| 2008/0307381 A1 | 12/2008 | Tritchkov et al. |
| 2010/0169846 A1 | 7/2010 | Gupta et al. |
| 2010/0215247 A1 | 8/2010 | Kitamura et al. |
| 2010/0248481 A1 | 9/2010 | Schultz |
| 2010/0306720 A1 * | 12/2010 | Pikus et al. ........................ 716/5 |
| 2011/0140278 A1 | 6/2011 | Chen et al. |
| 2012/0065910 A1 | 3/2012 | Yoshino |
| 2012/0131528 A1 | 5/2012 | Chen et al. |
| 2012/0185807 A1 | 7/2012 | Tsai et al. |
| 2013/0132914 A1 | 5/2013 | Sproch et al. |

* cited by examiner

METHOD OF GENERATING A SIMULATION MODEL OF A PREDEFINED FABRICATION PROCESS

PRIORITY CLAIM

The present application is a divisional of U.S. application Ser. No. 13/370,994, filed Feb. 10, 2012, now issued U.S. Pat. No. 8,887,106, which claims the priority of U.S. Provisional Patent Application No. 61/580,864, filed Dec. 28, 2011, which are incorporated herein by reference in their entireties.

BACKGROUND

In the course of Integrated Circuit (IC) development, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. At the same time, the scaling down process also increases the significance of process-induced inconsistency of the components, between their actual sizes and shapes as manufactured in a real IC and those as designed in an Electronic Design Automation (EAD) tool.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1A:
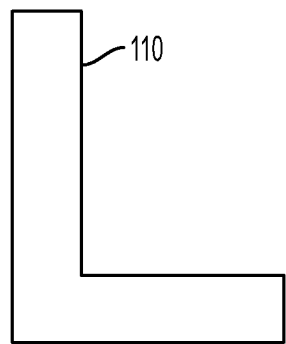
FIG. 1A is a top-view diagram of a layout design of a conductive feature to be manufactured by a predefined fabrication process in accordance with one or more embodiments.

It is understood that the following disclosure provides many different embodiments, or examples, for implementing different features of the disclosure. Specific examples of components and arrangements are described below to simplify the present disclosure. These are, of course, merely examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a top-view diagram of a layout design 110 of a conductive feature (depicted as conductive feature 120 in FIG. 1C) to be manufactured by a predefined fabrication process in accordance with one or more embodiments. The layout design 110 has an L-shape and, in some embodiments, is prepared by an IC designer using an EDA tool. In some embodiments, the layout design 110 has a shape other than the L-shape such as a rectangular shape, H-shape, a polygon, or combinations thereof. In some embodiments, the conductive feature 120 is a metallic conductive line, a poly-silicon conductive line, or a portion of a bulk substrate doped with N-type or P-type dopants.

Figure 1B:
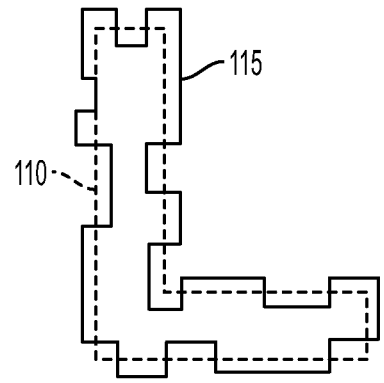
FIG. 1B is a top-view diagram of a modified layout design of the conductive feature of FIG. 1A in accordance with one or more embodiments.

FIG. 1B is a top-view diagram of a modified layout design 115 of the conductive feature in accordance with one or more embodiments. Because of non-ideal lithography effects and process variations, the actual resulting conductive feature will not be the same as the layout design 110 (as indicated using broken lines). Some examples of non-ideal lithography effects include distortions caused by the wavelength of the light source used in a lithography process or the reflections and/or scattering of the light. Some examples of process variations include variations in temperature, concentrations of etchants, or plasma energy levels. In order to compensate for distortions of the size and shape of the conductive feature caused by non-ideal lithography effects and process variations, the modified layout design 115 is prepared to be used in preparing a mask and forming the conductive feature.

Figure 1C:
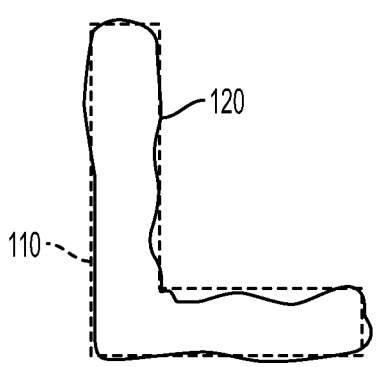
FIG. 1C is a top-view diagram of an actual conductive feature manufactured based on the modified layout design of FIG. 1B in accordance with one or more embodiments.
Figure 1D:
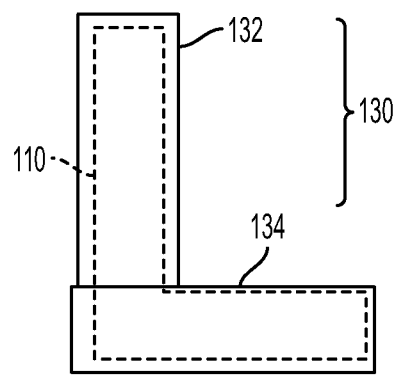
FIG. 1D is a top-view diagram of a bias-adjusted layout design of the actual conductive feature of FIG. 1C for parasitic extraction in accordance with one or more embodiments.

FIG. 1C is a top-view diagram of an actual conductive feature 120 manufactured based on the modified layout design 115. The conductive feature 120 is manufactured, based on the original layout design 110 (as indicated using broken lines), to have reduced distortions by taking the non-ideal lithography effects and process variations into account. FIG. 1D is a top-view diagram of a bias-adjusted layout design 130 of the actual conductive feature 120 for a subsequent parasitic extraction process. The parasitic extraction process refers to the generation of a circuit-level model representing the parasitic effects among conductive features, such as parasitic resistance, capacitance, and/or inductance. In some embodiments, the bias-adjusted layout design 130 is used as an equivalent representation of the conductive feature 120 during the parasitic extraction process. The bias-adjusted layout design 130 is obtained by dividing the original layout design 110 into one or more polygons 132 and 134 and then applying various bias adjustments to the contours of the polygons 132 and 134. In at least one embodiment, the term "bias adjustment" refers to adding or subtracting the length of a peripheral of the original layout design 110 by a predetermined value (i.e., a "bias amount"). The bias-adjusted layout design 130 need not be consistent with the actual shape and size of the conductive feature 120, but is a sufficient approximation of the conductive feature 120 in a subsequent parasitic extraction process.

Figure 2:
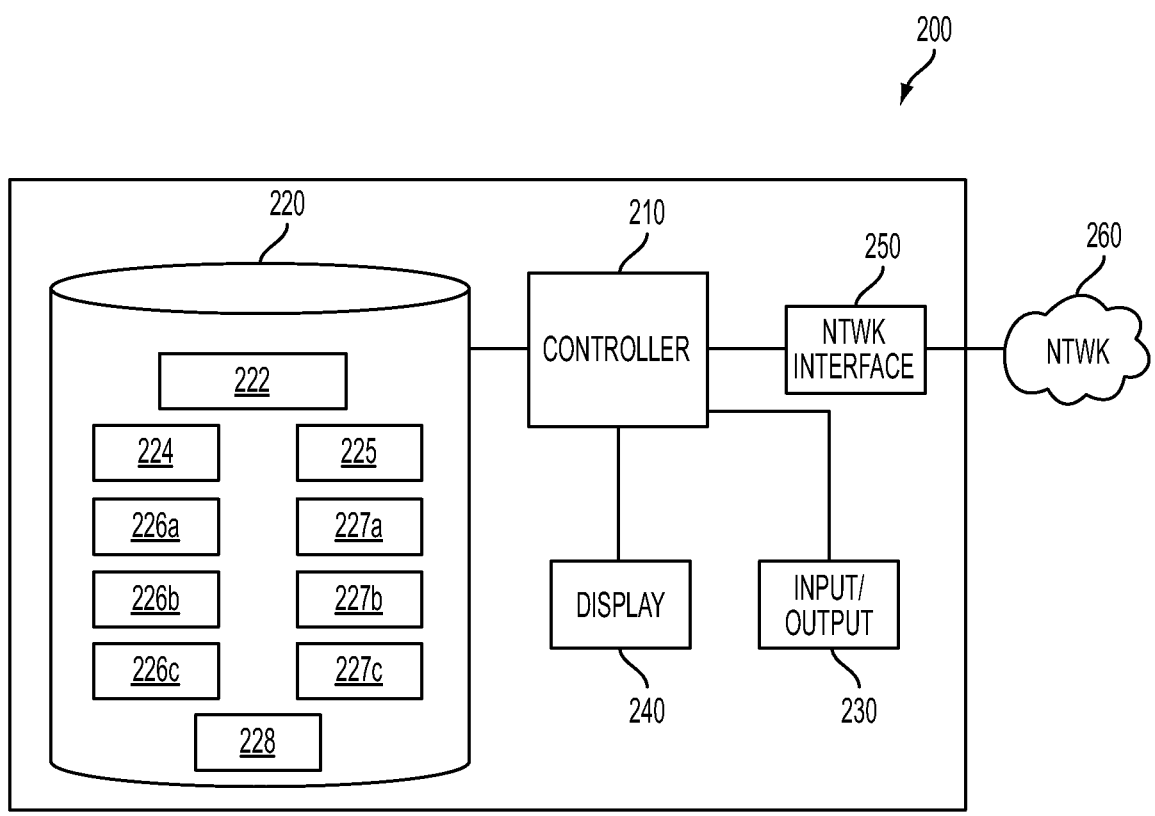
FIG. 2 is a functional block diagram of a computer system usable for implementing the method disclosed in FIG. 3 or FIG. 5 in accordance with one or more embodiments.
Figure 3:
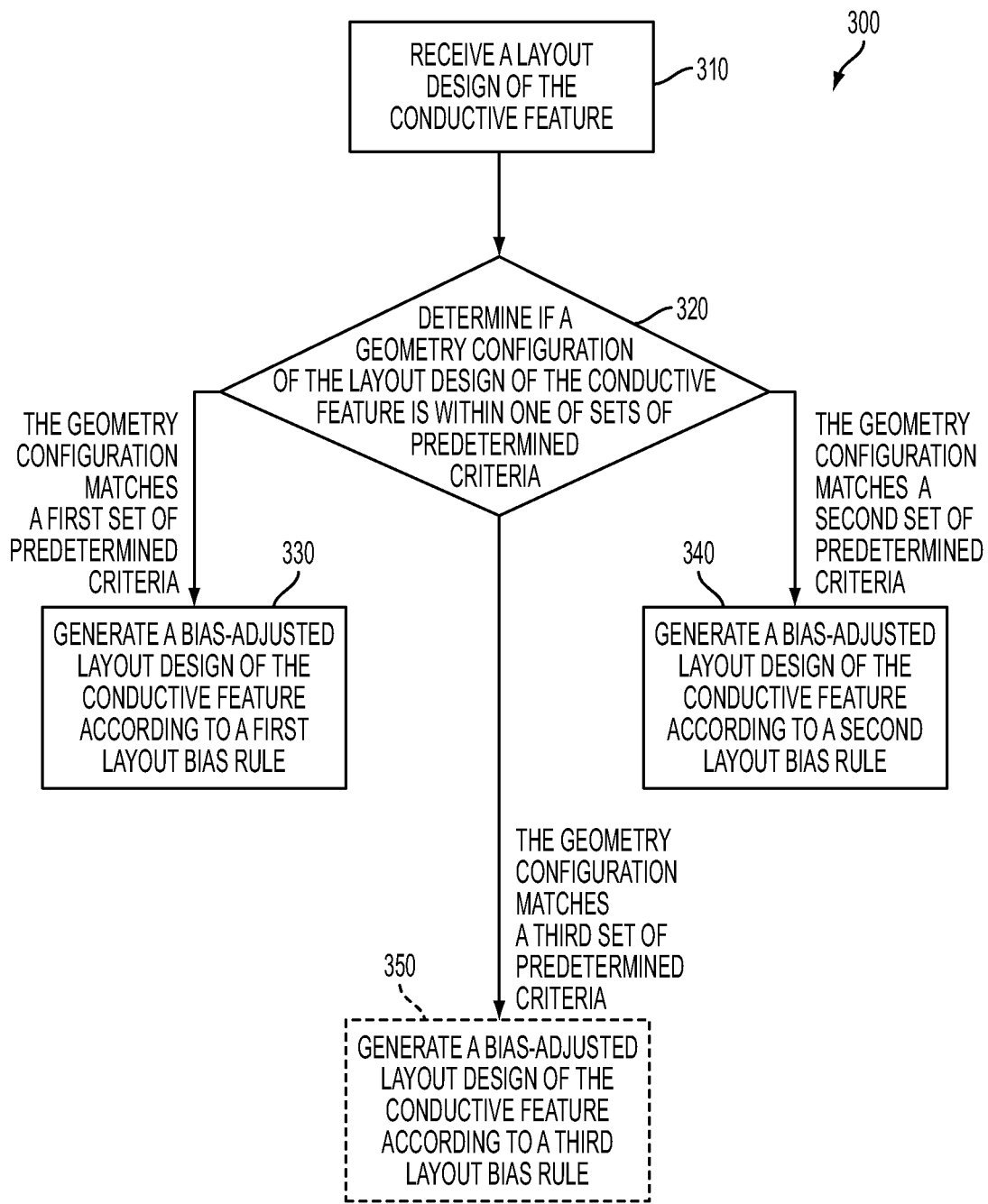
FIG. 3 is a flow chart of a method of generating a bias-adjusted layout design of a conductive feature in accordance with one or more embodiments.
Figure 5:
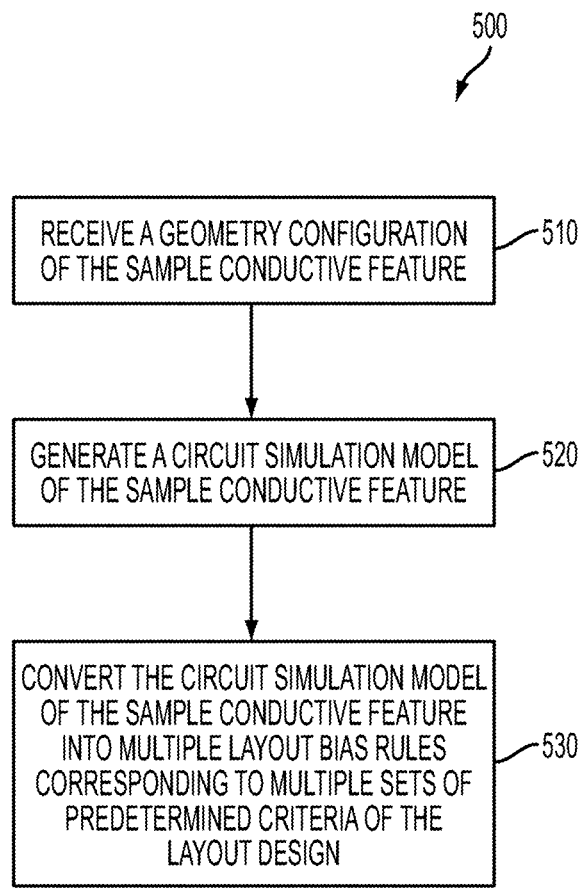
FIG. 5 is a flow chart of a method of generating a simulation model of the predefined fabrication process according to a sample conductive feature in accordance with one or more embodiments.

FIG. 2 is a functional block diagram of a computer system usable for implementing the method disclosed in FIG. 3 or FIG. 5 in accordance with one or more embodiments.

Computer system 200 includes a controller 210 and a computer readable storage medium 220 encoded with, i.e., storing, a computer program code 222, i.e., a set of executable instructions. The controller 210 is electrically coupled to the computer readable storage medium 220. The controller 210 is configured to execute the computer program code 222 encoded in the computer readable storage medium 220 in order to cause the computer to be usable as a layout design analyzer and/or parasitic extraction analyzer for performing the bias-adjustment and/or a parasitic extraction according to the bias-adjusted layout design of the conductive feature as depicted in FIG. 3 or as a simulation system that calculates a simulation model of the predefined fabrication process based on the conductive features as depicted in FIG. 5.

In some embodiments, the controller 210 is a central processing unit (CPU), a multi-processor, a distributed processing system, an application specific integrated circuit (ASIC), and/or a suitable processing unit.

In some embodiments, the computer readable storage medium 220 is an electronic, magnetic, optical, electromagnetic, infrared, and/or a semiconductor system (or apparatus or device). For example, the computer readable storage medium 220 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 220 includes a compact disk-read only memory (CD-ROM), a compact disk-read/write (CD-R/W), and/or a digital video disc (DVD).

In some embodiments, the storage medium 220 stores the computer program code 222 configured to cause the computer system 200 to perform a method as depicted in FIG. 3, a layout design 224 of a conductive feature, a plurality of sets of predetermined criteria 226a-226c of a geometry configuration of the layout design, and a plurality of layout bias rules 227a-227c. In some embodiments, the storage medium 220 stores the computer program code 222 configured to cause the computer system 200 to perform a method as depicted in FIG. 5, a layout design 224 of a conductive feature, geometry configuration 225 of the layout design, and a circuit-level simulation model 228 of the conductive feature.

Further, the computer system includes an input/output interface 230 and a display 240. The input/output interface 230 is coupled to the controller 210 and allows an IC designer or a simulation model designer to manipulate the computer system 200 in order to perform the methods depicted in FIG. 3 or FIG. 5. In at least some embodiments, the display 240 displays the status of operation of the methods depicted in FIG. 3 or FIG. 5 in a real-time manner and preferably provides a Graphical User Interface (GUI). In at least some embodiments, the input/output interface 230 and the display 240 allow an operator to operate the computer system 200 in an interactive manner.

In at least some embodiments, the computer system 200 also includes a network interface 250 coupled to the controller 210. The network interface 250 allows the computer system 200 to communicate with a network 260, to which one or more other computer systems are connected. The network interface includes wireless network interfaces such as BLUETOOTH, WIFI, WIMAX, GPRS, or WCDMA; or wired network interface such as ETHERNET, USB, or IEEE-1394. In some embodiments, the method of FIGS. 3 and 5 are implemented in two or more computer systems 200 of FIG. 2, and information such as a layout design, a Tech File, a circuit design, and/or other information are exchanged between different computer systems via the network 260.

FIG. 3 is a flow chart of a method 300 of generating a bias-adjusted layout design 130 in accordance with one or more embodiments. It is understood that additional processes may be performed before, during, and/or after the method 300 depicted in FIG. 3, and that some other processes may only be briefly described herein. In some embodiments, the method 300 is performed by a computer system 200 (FIG. 2) having a hardware controller 210 (FIG. 2) executing a set of computer readable instructions (such as computer program code 222 in FIG. 2).

In operation 310, the computer system 200 reads or receives a layout design 110 (also depicted in FIG. 2 as layout design 224), two or more sets of predetermined criteria (226a-226c in FIG. 2) of the layout design, and layout bias rules (227a-227c in FIG. 2) corresponding to each set of predetermined criteria 226a-226c. In operation 320, execution of the instructions by the controller 210 causes the computer system 200 to determine if a geometry configuration of the layout design 110 of the conductive feature 120 is within one of the sets of predetermined criteria 226a-226c of the layout design.

In at least one embodiment having two sets of predetermined criteria 226a and 226b of the layout design, the process moves to operation 330 if execution of computer program code 222 by computer system 200 determines that the geometry configuration of the layout design 110 of the conductive feature 120 is within a first set of predetermined criteria 226a. In operation 330, the bias-adjusted layout design 130 is generated according to a first layout bias rule 227a corresponding to the first set of predetermined criteria 226a after execution of computer program code 222 by computer system 200 determines that the geometry configuration of the layout design 110 of the conductive feature 120 is within the first set of predetermined criteria 226a. The process moves to operation 340 after execution of computer program code 222 by computer system 200 determines that the geometry configuration of the layout design 110 is within a second set of predetermined criteria 226b, and the bias-adjusted layout design 130 is generated according to a second layout bias rule 227b corresponding to the second set of predetermined criteria 226b after execution of computer program code 222 by computer system 200 determines that the geometry configuration of the layout design 110 is within the second set of predetermined criteria 226b.

In some embodiments, there are three sets of predetermined criteria 226a, 226b, and 226c of the layout design. The process moves to operation 350 if execution of computer program code 222 by computer system 200 determines that the geometry configuration of the layout design 110 is within a third set of predetermined criteria 226c, and the bias-adjusted layout design 130 is generated according to a third layout bias rule 227c corresponding to the third set of predetermined criteria 226c after the determination that the geometry configuration of the layout design 110 is within the third set of predetermined criteria 226c. In some embodiments, there are more than three sets of predetermined criteria with corresponding layout bias rules.

Figure 4A:
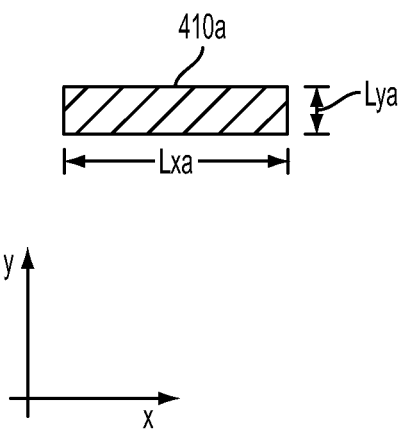
FIGS. 4A-4E are top-view diagrams of layout designs of a conductive feature and its neighboring conductive features in accordance with one or more embodiments.
Figure 4B:
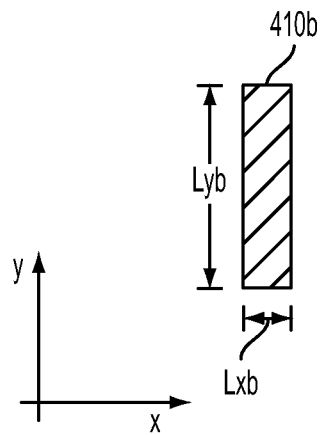
Figure 4C:
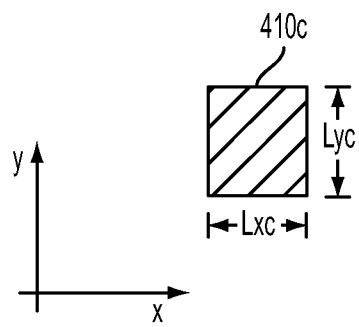

FIGS. 4A-4C are top-view diagrams of layout designs 410a, 410b, or 410c of a conductive feature in accordance with one or more embodiments.

As depicted in FIGS. 4A-4C, the layout designs 410a, 410b, and 410c of the conductive feature (such as a portion of the conductive feature 120 in FIG. 1) are rectangular. The layout design 410a has a first length $L_{xa}$ along an x direction and a second length $L_{ya}$ along a y direction. The layout design 410b has a first length $L_{xb}$ along an x direction and a second length $L_{yb}$ along a y direction. The layout design 410c has a first length $L_{xc}$ along an x direction and a second length $L_{yc}$ along a y direction. The different sets of predetermined criteria 226a-226c are used to determine which one of the first length $L_{xa}$, $L_{xb}$, or $L_{xc}$ and the second length $L_{ya}$, $L_{yba}$, or $L_{yc}$ is the length or width of the conductive feature 410a, 410b, or 410c.

In at least one embodiment, the first set of predetermined criteria includes a ratio of the first length $L_{xa}$ to the second length $L_{ya}$ ($L_{xa}/L_{ya}$) being greater than a first predetermined threshold ratio. In other words, the first length $L_{xa}$ is the length and the second length $L_{ya}$ is the width of the layout design 410a. The first layout bias rule is to apply a line-end bias adjustment to the first length $L_{xa}$ and apply a line-width bias adjustment to the second length $L_{ya}$. In at least one embodiment, the second set of predetermined criteria includes a ratio of the second length $L_{yb}$ to the first length $L_{xb}$ ($L_{yb}/L_{xb}$) greater than a second predetermined threshold ratio. In other words, the first length $L_{xb}$ is the width and the second length $L_{yb}$ is the length of the layout design 410b. The second layout bias rule is to apply the line-end bias adjustment to the second length $L_{yb}$ and apply the line-width bias adjustment to the first length $L_{ya}$.

In some embodiments, the first predetermined threshold ratio and the second predetermined ratio ranges from 1.05 to 1.2.

In some embodiments, as depicted in FIG. 4C, if the geometry configuration of the layout design 410c does not fall within the above-mentioned first or second sets of predetermined criteria, a line-end bias adjustment is applied to both the first length $L_{xc}$ and the second length $L_{yc}$ of the conductive feature. In other words, the third set of predetermined criteria comprises a ratio of the first length $L_{xc}$ to the second length $L_{yc}$ ranging from the first predetermined threshold ratio and a ratio which is the inverse of the second predetermined threshold ratio.

Figure 4D:
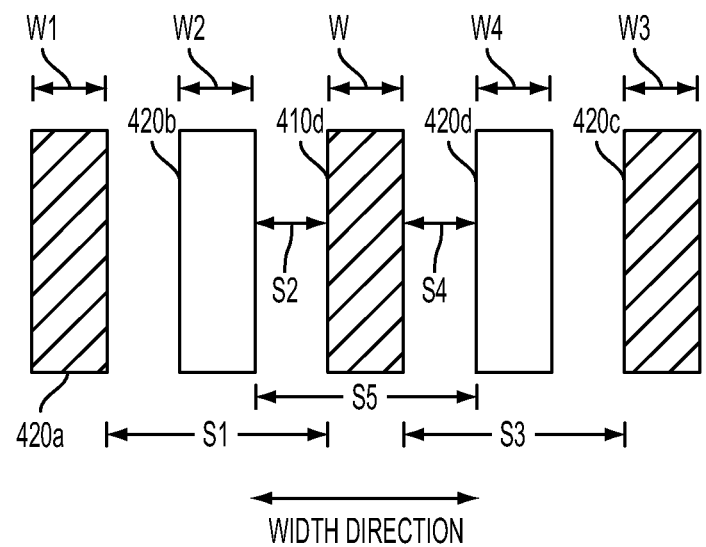

FIG. 4D is a top-view diagram of layout design 410d of a conductive feature and layout designs 420a-420d of the neighboring conductive features in accordance with one or more embodiments. The layout design 410d has four neighboring conductive features (as represented by layout designs 420a-420d) in parallel with the layout designs 410d. The layout design 410d has a pattern width W along a predetermined width direction. The layout design 420a of a first neighboring conductive structure is positioned to the left of the layout design 410d, has a pattern width $W_1$, and a gap width $S_1$ between the layout designs 410c and the layout design 420a. The layout design 420b of a second neighboring conductive structure is positioned between the layout design 410d and the layout design 420a, has a pattern width $W_2$, and a gap width $S_2$ between the layout design 410d and the layout design 420b. The layout design 420c of a third neighboring conductive structure is positioned to the right of the layout design 410d, has a pattern width $W_3$, and a gap width $S_3$ between the layout designs 410d and the layout design 420c. The layout design 420d of a fourth neighboring conductive structure is positioned between the layout design 410d and the third layout design 420c, has a pattern width $W_4$, and a gap width $S_4$ between the layout design 410d and the layout design 420d. In some embodiments, there are more or less than four neighboring conductive structures around the conductive feature whose layout design 410d that is being reviewed and adjusted for subsequent parasitic extraction.

In some embodiments, various sets of predetermined criteria are defined according to given ranges of (1) pattern widths $W_1$, $W_2$, $W_3$, and/or $W_4$ of layout designs of four neighboring conductive features and (2) gap widths $S_1$, $S_2$, $S_3$, and/or $S_4$ of spacing between the layout design 410d of the conductive feature and the corresponding layout designs 420a-420d of the four neighboring conductive features. For example, in some embodiments, if the layout design 410d and the layout designs 420a-420d have a geometry relationship within a first set of ranges of the pattern widths $W_1$, $W_2$, $W_3$, and/or $W_4$ and gap widths $S_1$, $S_2$, $S_3$, and/or $S_4$, a first layout bias rule that defining a first line-width bias adjustment is applied to the pattern width W of the layout design 410d of the conductive feature. In some embodiments, if the geometry relationship of the layout design 410d and the layout designs 420a-420d is within a second set of ranges of the pattern widths $W_1$, $W_2$, $W_3$, and/or $W_4$ and gap widths $S_1$, $S_2$, $S_3$, and/or $S_4$, a second layout bias rule defining a first line-width bias adjustment is applied to the pattern width W of the layout design 410d of the conductive feature.

In some embodiments, the pattern widths $W_1$, $W_2$, $W_3$, and/or $W_4$ and the gap widths $S_1$, $S_2$, $S_3$, and/or $S_4$ range from 0.03 μm to 4 μm. In some embodiments, the first line-width bias adjustment and the second line-width bias adjustment range from 1 nm to 20 nm.

In some embodiments, a layout design of a neighboring conductive feature, such as the layout design 420b or 420d, is ignored if the layout design 410d of the conductive feature and the layout design 420b or 420d of the neighboring conductive features belong to different masks. In some embodiments, whether the layout designs 410d and 420b or 420d belong to different masks is identified by an indicator, such as a value stored in the computer readable storage medium 220 in FIG. 2, recorded with the layout designs 410d and 420b or 420d (sometimes known as a "color code" of a layout design). Layout designs belonging to the same mask have the same color code.

In at least one embodiment, whether the layout designs 410d and 420b or 420d belong to different masks is identified by analyzing a gap width $S_2$ or $S_4$ of spacing between the layout design 410d of the conductive feature and the layout design 420b or 320d of the neighboring conductive feature. In at least one embodiment, the gap width $S_2$ or $S_4$ is compared with a predetermined gap width value (sometimes known as a "G-0 rule"). If the comparison result indicates that the gap width $S_2$ or $S_4$ is less than the predetermined gap width value, the layout design 410d of the conductive feature and the layout design 420b or 420d of the neighboring conductive feature belong to different masks, and thus the layout design 420b or 420d are ignored in determining a suitable bias adjustment for the layout design 410d. The predetermined gap width value (e.g., the G-0 rule) is defined based on the limitations of the deposition, etching, and/or lithographic processes of the predefined fabrication process that fabricating two adjacent features, having a gap less than the G-0 rule, using the same mask is not feasible. In some embodiments, predetermined gap width value ranges from 30 nm to 100 nm.

Figure 4E:
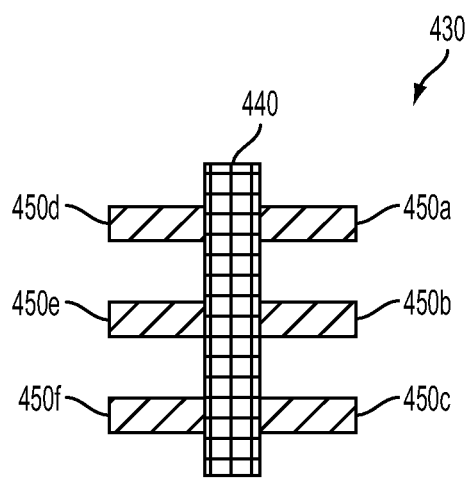

In some embodiments, the conductive feature 410a, 410b, 410c, or 410d comprises a metallic conductive line, a polysilicon conductive line, or a portion of a bulk substrate doped with N-type or P-type dopants. FIG. 4E is a top-view diagram of a fin field-effect transistor (FinFET) 430. In some embodiments, the method as depicted in FIG. 3 is applicable to the generation of the bias-adjusted layout designs for the FinFET 430 as well. The FinFET 430 has a gate structure 440 formed over a plurality of fins working as channel regions. The FinFET 430 also has a plurality of source-drain fin-extension structures 450a-450f extending from the fins and operable as drain and source electrodes. In at least one embodiment, each source-drain fin-extension structure 450a-450f is formed by a portion of a bulk substrate doped with N-type or P-type dopants. In some embodiments, each layout design for individual source-drain fin-extension structure 450a-450f is identified and analyzed according to the method depicted in FIG. 3 in order to generate a bias-modified layout for the source-drain fin-extension structures 450a-450f.

FIG. 5 is a flow chart of a method 500 of generating a simulation model of the predefined fabrication process according to a conductive feature (such as the conductive feature 120 of FIG. 1) in accordance with one or more embodiments. It is understood that additional processes may be performed before, during, and/or after the method 500 depicted in FIG. 5, and that some other processes may only be briefly described herein. In some embodiments, the method 500 is performed by a computer system 200 (FIG. 2) having a hardware controller 210 (FIG. 2) executing a set of computer readable instructions (such as computer program code 222 in FIG. 2).

In operation 510, the computer system 200 reads or receives a geometry configuration 225 of the sample conductive feature 120 and a layout design 110 (also depicted in FIG. 2 as layout design 224) of the conductive feature 120. In some embodiments, the geometry configuration 225 of the conductive feature 120 is measured based on an actually-made conductive feature. In some other embodiments, the geometry configuration of the conductive feature 120 is determined by performing a simulation based on layout design 224 and estimating process-induced distortions of the predefined fabrication process.

In operation 520, a circuit-level simulation model 228 of the conductive feature 120 based on the geometry configuration 225 of the conductive feature 120 is generated. In some embodiments, the circuit-level simulation model 228 of the sample conductive feature 120 is generated by performing an electromagnetic field simulation that derives the circuit-level simulation model from the characteristics based on Maxwell's equations. In some embodiments, operation 520 is performed by using an optical proximity correction (OPC) simulation tool with pre-characterized libraries, which include many converting rules from drawing layout configuration to actual layout configuration.

In some embodiments, the geometry configuration 225 of the sample conductive feature 120 is too complex for a parasitic extraction tool to calculate parasitic conductance and/or resistance efficiently. In operation 530, the hardware controller 210 converts and simplifies the circuit-level simulation 228 model of the sample conductive feature 120 into at least a first layout bias rule 227a corresponding to a first set of predetermined criteria 226a of the layout design and a second layout bias rule 227b corresponding to a second set of predetermined criteria 226b of the layout design. The second layout bias rule 227a is different from the first layout bias rule 227b. The sets of predetermined criteria 226a-226c and corresponding layout bias rules 227a-227c are collectively referred to as the simulation model of the predefined fabrication process. The simulation model of the predefined fabrication process is usable to generate a bias-adjusted layout design (such as 130 in FIG. 1D) from the layout design 110 of the sample conductive feature 120 as depicted in FIGS. 3 and 5. Subsequently, in some embodiments, the bias-adjusted layout design 130 is usable as a proximate model for the parasitic extraction tool to calculate parasitic resistance and capacitance with sufficient calculation efficiency and accuracy.

In at least one embodiment, the method of FIG. 5 further stores the simulation model of the predefined fabrication process, including sets of predetermined criteria of the layout design and their corresponding layout bias rules, within a file (sometimes known as a "Tech File") in a computer readable medium (such as a computer readable storage medium 220 in FIG. 5). In some embodiments, the sets of predetermined criteria of the layout design and corresponding layout bias rules are embodied in a set of executable instructions. In some embodiments, the method of FIG. 3 is performed based on the Tech File. In at least one embodiment, the controller 210 performs the method of FIG. 3 by loading and executing the Tech File.

In some embodiments, a method of generating a simulation model of a predefined fabrication process according to a sample conductive feature includes receiving a geometry configuration of the sample conductive feature and a layout design of the sample conductive feature. A circuit-level simulation model of the sample conductive feature based on the geometry configuration of the sample conductive feature is generated. A hardware processor converts the circuit-level simulation model of the sample conductive feature into at least a first layout bias rule corresponding to a first set of predetermined criteria of the layout design and a second layout bias rule, different from the first layout bias rule, corresponding to a second set of predetermined criteria of the layout design.

In some embodiments, a method of generating a simulation model of a predefined fabrication process according to a sample conductive feature includes receiving a layout design of the sample conductive feature and determining a geometry configuration of the sample conductive feature based on the layout design of the sample conductive feature. A circuit-level simulation model of the sample conductive feature based on the geometry configuration of the sample conductive feature is generated. A hardware processor converts the circuit-level simulation model of the sample conductive feature into at least a first layout bias rule corresponding to a first set of predetermined criteria of the layout design and a second layout bias rule, different from the first layout bias rule, corresponding to a second set of predetermined criteria of the layout design.

In some embodiments, a computer system includes a non-transitory computer readable storage medium encoded with a computer program code and a processor coupled to the non-transitory computer readable storage medium. The processor is configured to execute the computer program code, the computer program code being arranged to cause the processor to: receive a layout design of a sample conductive feature, the sample conductive feature being a portion of an integrated circuit; generate a circuit-level simulation model of the sample conductive feature based on a geometry configuration of the sample conductive feature determined from the layout design of the sample conductive feature; and convert the circuit-level simulation model of the sample conductive feature into at least a first layout bias rule corresponding to a first set of predetermined criteria of the layout design and a second layout bias rule, different from the first layout bias rule, corresponding to a second set of predetermined criteria of the layout design.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating a simulation model according to a sample conductive feature, the method comprising:
   receiving a geometry configuration of the sample conductive feature and a layout design of the sample conductive feature;
   generating a circuit-level simulation model of the sample conductive feature based on the geometry configuration of the sample conductive feature; and
   converting, by a hardware processor, the circuit-level simulation model of the sample conductive feature into a first layout bias rule corresponding to a first set of predetermined criteria of the layout design and into a second layout bias rule, different from the first layout bias rule, corresponding to a second set of predetermined criteria of the layout design, wherein at least one of the first set of predetermined criteria or the second set of predetermined criteria comprises a ratio of a first length of the sample conductive feature along a first direction and a second length of the sample conductive feature along a second direction.

2. The method of claim 1, wherein:
   receiving the layout design comprises receiving the layout design of the sample conductive feature having the first length along the first direction and the second length along the second direction; and
   converting the circuit-level simulation model comprises converting the circuit-level simulation model into the first layout bias rule comprising applying a line-end bias to the first length and a line-width bias to the second length when the ratio is greater than a first predetermined threshold ratio.

3. The method of claim 2, wherein converting the circuit-level simulation model further comprises converting the circuit-level simulation model into the second layout bias rule comprising applying the line-end bias to the second length and the line-width bias to the first length when the ratio is greater than a second predetermined threshold ratio.

4. The method of claim 1, wherein:
   receiving the layout design comprises receiving the layout design of the sample conductive feature having a pattern width along a predetermined direction; and
   converting the circuit-level simulation model comprises converting the circuit-level simulation model into the first layout bias rule comprising applying a first line-width bias to the pattern width of the layout design of the sample conductive feature, the first set of predetermined criteria comprising a first set of ranges of pattern widths of layout designs of four neighboring conductive features and gap widths of spacing between the layout design of the sample conductive feature and corresponding layout designs of the four neighboring conductive features.

5. The method of claim 4, wherein converting the circuit-level simulation model further comprises converting the circuit-level simulation model into the second layout bias rule comprising applying a second line-width bias to the pattern width of the layout design of the sample conductive feature, the second set of predetermined criteria comprising a second set of ranges of the pattern widths of the layout designs of the four neighboring conductive features and the gap widths of the spacing between the layout design of the sample conductive feature and the corresponding layout designs of the four neighboring conductive features.

6. The method of claim 1, wherein receiving the layout design comprises receiving the layout design of the sample conductive feature and a layout design of a neighboring conductive feature, the layout design of the sample conductive feature and the layout design of the neighboring conductive feature comprising information indicating whether or not the layout design of the sample conductive feature and the layout design of the neighboring conductive feature belong to different masks.

7. The method of claim 6, wherein converting the circuit-level simulation model comprises converting the circuit-level simulation model into the first layout bias rule corresponding to the first set of predetermined criteria ignoring the layout design of the neighboring conductive feature after determining that the layout design of the sample conductive feature and the layout design of the neighboring conductive feature belong to different masks.

8. The method of claim 1, further comprising storing at least one of the first layout bias rule, the first set of predetermined criteria, the second layout bias rule, or the second set of predetermined criteria in a file on a non-transitory computer readable storage medium.

9. The method of claim 1, further comprising converting at least one of the first layout bias rule, the first set of predetermined criteria, the second layout bias rule, or the second set of predetermined criteria into executable instructions.

10. A method of generating a simulation model according to a sample conductive feature, the method comprising:
    receiving a layout design of the sample conductive feature;
    determining a geometry configuration of the sample conductive feature based on the layout design of the sample conductive feature;
    generating a circuit-level simulation model of the sample conductive feature based on the geometry configuration of the sample conductive feature; and
    converting, by a hardware processor, the circuit-level simulation model of the sample conductive feature into a first layout bias rule corresponding to a first set of predetermined criteria of the layout design and into a second layout bias rule, different from the first layout bias rule, corresponding to a second set of predetermined criteria of the layout design, wherein at least one of the first set of predetermined criteria or the second set of predetermined criteria comprises a ratio of a first length of the sample conductive feature along a first direction and a second length of the sample conductive feature along a second direction.

11. The method of claim 10, wherein determining the geometry configuration of the sample conductive feature comprises performing a simulation based on the layout design of the sample conductive feature and estimating process-induced distortions.

12. The method of claim 10, wherein:
    receiving the layout design comprises receiving the layout design of the sample conductive feature having a first length along a first direction and a second length along a second direction; and
    converting the circuit-level simulation model comprises:
      converting the circuit-level simulation model into the first layout bias rule comprising applying a line-end bias to the first length and a line-width bias to the second length when the ratio is greater than a first predetermined threshold ratio; and
      converting the circuit-level simulation model into the second layout bias rule comprising applying the line-end bias to the second length and the line-width bias to the first length when the ratio is greater than a second predetermined threshold ratio.

13. The method of claim 10, wherein:
receiving the layout design comprises receiving the layout design of the sample conductive feature having a pattern width along a predetermined direction; and
converting the circuit-level simulation model comprises:
converting the circuit-level simulation model into the first layout bias rule comprising applying a first line-width bias to the pattern width of the layout design of the sample conductive feature, the first set of predetermined criteria comprising a first set of ranges of pattern widths of layout designs of four neighboring conductive features and gap widths of spacing between the layout design of the sample conductive feature and corresponding layout designs of the four neighboring conductive features; and
converting the circuit-level simulation model into the second layout bias rule comprising applying a second line-width bias to the pattern width of the layout design of the sample conductive feature, the second set of predetermined criteria comprising a second set of ranges of the pattern widths of the layout designs of the four neighboring conductive features and the gap widths of the spacing between the layout design of the sample conductive feature and the corresponding layout designs of the four neighboring conductive features.

14. The method of claim 10, wherein:
receiving the layout design comprises receiving the layout design of the sample conductive feature and a layout design of a neighboring conductive feature, the layout design of the sample conductive feature and the layout design of the neighboring conductive feature comprising information indicating whether or not the layout design of the sample conductive feature and the layout design of the neighboring conductive feature belong to different masks; and
converting the circuit-level simulation model comprises converting the circuit-level simulation model into the first layout bias rule corresponding to the first set of predetermined criteria ignoring the layout design of the neighboring conductive feature after determining that the layout design of the sample conductive feature and the layout design of the neighboring conductive feature belong to different masks.

15. The method of claim 10, further comprising storing at least one of the first layout bias rule, the first set of predetermined criteria, the second layout bias rule, or the second set of predetermined criteria in a file on a non-transitory computer readable storage medium.

16. The method of claim 10, further comprising converting at least one of the first layout bias rule, the first set of predetermined criteria, the second layout bias rule, or the second set of predetermined criteria into executable instructions.

17. A computer system comprising:
a first non-transitory computer readable storage medium encoded with a computer program code; and
a processor coupled to the first non-transitory computer readable storage medium, the processor being configured to execute the computer program code, the computer program code being arranged to cause the processor to:
receive a layout design of a sample conductive feature, the sample conductive feature being a portion of an integrated circuit;
generate a circuit-level simulation model of the sample conductive feature based on a geometry configuration of the sample conductive feature determined from the layout design of the sample conductive feature; and
convert the circuit-level simulation model of the sample conductive feature into at least a first layout bias rule corresponding to a first set of predetermined criteria of the layout design and a second layout bias rule, different from the first layout bias rule, corresponding to a second set of predetermined criteria of the layout design; and
calculate parasitic resistance and capacitance of the sample conductive feature using the first layout bias rule and the second layout bias rule.

18. The computer system of claim 17, wherein the computer program code is further arranged to cause the processor to determine the geometry configuration of the sample conductive feature by performing a simulation based on the layout design of the sample conductive feature and estimating process-induced distortions.

19. The computer system of claim 17, wherein the computer program code is further arranged to cause the processor to store at least one of the first layout bias rule, the first set of predetermined criteria, the second layout bias rule, or the second set of predetermined criteria in a file on the first non-transitory computer readable storage medium or on a second non-transitory computer readable storage medium.

20. The computer system of claim 17, wherein the computer program code is further arranged to cause the processor to convert at least one of the first layout bias rule, the first set of predetermined criteria, the second layout bias rule, or the second set of predetermined criteria into executable instructions.

* * * * *